United States Patent [19]

Petrosian et al.

[11] Patent Number: 4,525,460
[45] Date of Patent: Jun. 25, 1985

[54] SINGLE-CRYSTAL MATERIAL BASED ON ALUMINIUM GARNETS

[76] Inventors: Ashot G. Petrosian, ulitsa Abovyana, 39, kv. 16, Erevan; Khachik S. Bagdasarov, ultisa Profsojuznaya, 115, kv. 46, Moscow; Armen S. Kuzanian, ulitsa Moskovskava, 31, kv. 14; Karine L. Ovanesian, ulitsa Tamaniana, 3, kv. 59, both of Erevan; Tatyana I. Butaeva, ulitsa Charentsa, 27, kv. 3, Erevan, all of U.S.S.R.

[21] Appl. No.: 552,137

[22] PCT Filed: Feb. 26, 1982

[86] PCT No.: PCT/SU82/00010
§ 371 Date: Oct. 24, 1983
§ 102(e) Date: Oct. 24, 1983

[87] PCT Pub. No.: WO83/02962
PCT Pub. Date: Sep. 1, 1983

[51] Int. Cl.³ .................. C04B 27/00; C30B 29/28
[52] U.S. Cl. ................................ 501/86; 423/263; 423/265; 501/152

[58] Field of Search ............... 501/86, 152; 423/265, 423/263

[56] References Cited

U.S. PATENT DOCUMENTS 3,420,780 1/1969 Forrat et al. ..................... 501/86

FOREIGN PATENT DOCUMENTS 152908 4/1974 Czechoslovakia .
55-36639 9/1980 Japan .
594628 5/1978 U.S.S.R. .

OTHER PUBLICATIONS

WO83/02962, PCT/SU/82/00010, Sep. 1, 1983, Petrosian, et al.
Journal of Crystal Growth, vol. 56, No. 3, (Feb. 1982), pp. 677–689.

*Primary Examiner*—Mark L. Bell
*Attorney, Agent, or Firm*—Lilling & Greenspan

[57] ABSTRACT

A single-crystalline material based on aluminium garnets of the general formula $Re_3Al_5O_{12}$, wherein Re=Y, Dy, Ho, Er, Lu and containing a dyeing additive of a red color spectrum, viz. specifically zirconium, in an amount ranging from $10^{-2}$ to 3% by weight.

6 Claims, No Drawings

SINGLE-CRYSTAL MATERIAL BASED ON ALUMINIUM GARNETS

FIELD OF THE INVENTION

The present invention relates to the art of artificial single crystals and, more specifically, to a single-crystal material based on aluminium garnets.

BACKGROUND OF THE INVENTION

Known in the art is a single-crystal material based on yttrium-aluminium garnet ($Y_3Al_5O_{12}$) containing chromium as a dyeing additive in an amount of 0.01 to 3% by weight. This material has a green colour and a red luminescence (cf. ČSSR Pat. No. 152,908 Cl. B 01 J 17/02, published 08.12.71).

Also known is a single-crystalline Jewelry material based on yttrium-aluminium garnet, wherein as the dyeing additive titanium is used in an amount of from $1.10^{-4}$ to 1% by weight. This material has a clearly pronounced brown colour under daylight passing to a reddish colour at an artificial illumination (cf. USSR Inventor's Certificate No. 594628, Cl. B 01 J 17/00, Bulletin No. 17 published in 1978).

The use of these dyeing additives in the above-mentioned single-crystalline materials does not make it possible to obtain a red dyeing spectrum.

SUMMARY OF THE INVENTION

The present invention is directed to the provision of a single-crystalline material based on aluminium garnets which, through the selection of a novel dyeing additive, would have colours of a red spectrum.

This object is accomplished by that of a single-crystalline material based on aluminium garnets of the general formula: $Re_3Al_5O_{12}$, wherein $Re = Y$, Dy, Ho, Er, Lu and incorporating a dyeing additive containing, as the latter, zirconium in an amount of from $10^{-2}$ to 3% by weight.

To impart a red colour to a single-crystalline material based on yttrium-aluminium garnet, it preferably contains zirconium in an amount of from $10^{-2}$ to 3% by weight.

A single-crystalline material based on dyeprosium-aluminium garnet, for the purpose of imparting a red colour thereto, preferably contains zirconium in an amount of from $10^{-2}$ to 3% by weight.

To impart a reddish-brown colour, a single-crystalline material based on holmium-aluminium garnet preferably contains zirconium in an amount of from $10^{-2}$ to 3% by weight. A single-crystalline material based on erbium-aluminium garnet preferably contains, for the purpose of imparting a red-yellow-brown colour thereto, zirconium in an amount of from $10^{-2}$ to 3% by weight.

To impart a red colour, a single-crystalline material based on lutecium-aluminium garnet preferably contains zirconium in an amount of from $10^{-2}$ to 3% by weight.

The single-crystalline material according to the present invention, owing to the use of a novel dyeing additive, has a red colour spectrum sufficiently close to that of corresponding naturally-occurring almandine, pyrope, hessonites or hyacinth.

DETAILED DESCRIPTION OF THE INVENTION

The single-crystalline material based on aluminium garnets according to the present invention can be produced by known methods of growing refractory single crystals from a melt, e.g. using Bridgeman-Stockbarger, Chokhralsky methods, debiteuse and the like. Basically use is made of aluminium garnets of the general formula $Re_3Al_5O_{12}$, wherein $Re = Y$, Dy, Ho, Er, Lu. The dyeing additive is introduced into the starting material as zirconia ($ZrO_2$). For a better understanding of the present invention the following Examples illustrating the single-crystalline material according to the invention are given below.

EXAMPLE 1

A single-crystalline material based on yttrium-aluminium garnet $Y_3Al_5O_{12}$ containing zirconium as a dyeing additive in the amount of 0.01% by weight is prepared by the Bridgeman-Stockbarger method. A mixture of oxides consisting of the following components, percent by weight:

| | |
|---|---|
| $Y_2O_3$ | 57.060 |
| $Al_2O_3$ | 42.926 |
| $ZrO_2$ | 0.014 | is charged into a molybdenum container, heated to a temperature of the order of 2,000° C. and crystallized at the speed of movement of the drawing mechanism of 2 mm/hr. The thus-produced crystal has a light-red colour.

EXAMPLE 2

A single-crystalline material based on $Y_3Al_5O_{12}$ containing zirconium as the dyeing additive in the amount of 0.75% by weight is produced in a manner similar to that described in the foregoing Example 1. As the starting components a mixture is used consisting of the following oxides, percent by weight:

| | |
|---|---|
| $Y_2O_3$ | 56.06 |
| $Al_2O_3$ | 42.90 |
| $ZrO_2$ | 1.04 |

The resulting crystal has a dark-red colour resembling that of almandine and pyrope.

EXAMPLE 3

A single-crystalline material based on dysprosium-aluminium garnet $Dy_3Al_5O_{12}$ containing zirconium as the dyeing additive in the amount of 1% by weight is obtained as described in a manner similar to that described in Example 1. As the starting components use is made of a mixture of oxides of the following composition, percent by weight:

| | |
|---|---|
| $Dy_2O_3$ | 67.772 |
| $Al_2O_3$ | 30.877 |
| $ZrO_2$ | 1.35 |

The thus-produced crystal is not transparent and has a dark-cherry shade. In small-size articles the material has the colour close to that of almandines and pyropes.

EXAMPLE 4

A single-crystalline material based on dysprosium-aluminium garnet $Dy_3Al_5O_{12}$ containing zirconium as the dyeing additive in the amount of 0.56% by weight is obtained in a manner similar to that described in Example 1. As the starting components a mixture of oxides of the following composition is used, percent by weight:

| | |
|---|---|
| $Dy_2O_3$ | 68.184 |
| $Al_2O_3$ | 31.065 |
| $ZrO_2$ | 0.75 |

The thus-produced crystal has an intensive cherry-red colour.

EXAMPLE 5

A single-crystalline material based on lutecium-aluminium garnet $Lu_3Al_5O_{12}$ containing zirconium as the dyeing additive in the amount of 0.53% by weight is prepared in a manner similar to that described in Example 1 hereinbefore. As the starting components a mixture of the following composition is used, percent by weight:

| | |
|---|---|
| $Lu_2O_3$ | 69.22 |
| $Al_2O_3$ | 30.06 |
| $ZrO_2$ | 0.72 |

The thus-produced crystal has an intensive red colour.

EXAMPLE 6

A single-crystalline material based on holmium-aluminium garnet $Ho_3Al_5O_{12}$ containing zirconium as the dyeing additive in the amount of 0.4% by weight is produced in a manner similar to that of Example 1. As the starting components a mixture of the following oxides is used, percent by weight:

| | |
|---|---|
| $Ho_2O_3$ | 68.63 |
| $Al_2O_3$ | 30.87 |
| $ZrO_2$ | 0.5 |

The thus-produced crystal has a red-yellow-brown colour.

EXAMPLE 7

A single-crystalline material based on erbium-aluminium garnet $Er_3Al_5O_{12}$ containing zirconium as the dyeing additive in the amount of 0.4% by weight is produced in a manner similar to that described in Example 1. As the starting components a mixture of the following oxides is used, percent by weight:

| | |
|---|---|
| $Er_2O_3$ | 68.88 |
| $Al_2O_3$ | 30.62 |
| $ZrO_2$ | 0.5 |

The thus-produced crystal has a reddish-brown colour.

The single-crystalline material according to the present invention based on aluminium garnets can be useful, in particular, in the manufacture of insertion pieces for jewelry.

Incorporation of zirconium into yttrium-aluminium garnet imparts to the latter a red colour of different shades close to those of naturally-occurring almandines and pyropes.

We claim:

1. A single-crystalline aluminum garnet material consisting of $Re_3Al_5O_{12}$ and $10^{-2}$ to 3% by weight of the dyeing additive zirconium, wherein Re is an element from the group consisting of yttrium, dysprosium, holmium, erbium, and lutecium.

2. A single-crystalline material according to claim 1, wherein Re is yttrium and said material imparts a red color.

3. A single crystalline material according to claim 1, wherein Re is dysprosium and said material imparts a cherry color.

4. A single-crystalline material according to claim 1, wherein Re is holmium and said material imparts a reddish brown color.

5. A single-crystalline material according to claim 1, wherein Re is erbium and said material imparts a red-yellow-brown color.

6. A single-crystalline material according to claim 1, wherein Re is lutecium and said material imparts a red color.

* * * * *